United States Patent
Agata et al.

(10) Patent No.: US 9,299,771 B2
(45) Date of Patent: Mar. 29, 2016

(54) SEMICONDUCTOR DEVICE WITH AN ELECTRIC FIELD REDUCTION MECHANISM IN AN EDGE TERMINATION REGION SURROUNDING THE ACTIVE REGION

(71) Applicant: FUJI ELECTRIC CO., LTD., Kawasaki (JP)

(72) Inventors: Yasunori Agata, Matsumoto (JP); Takashi Shiigi, Matsumoto (JP); Dawei Cao, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/643,748

(22) Filed: Mar. 10, 2015

(65) Prior Publication Data
US 2015/0187870 A1 Jul. 2, 2015

Related U.S. Application Data

(63) Continuation of application No. PCT/JP2013/081438, filed on Nov. 21, 2013.

(30) Foreign Application Priority Data

Nov. 29, 2012 (JP) .................................. 2012-261222

(51) Int. Cl.
*H01L 29/06* (2006.01)
*H01L 29/40* (2006.01)
(Continued)

(52) U.S. Cl.
CPC .......... *H01L 29/0619* (2013.01); *H01L 29/404* (2013.01); *H01L 29/408* (2013.01); *H01L 29/4941* (2013.01); *H01L 29/7395* (2013.01); *H01L 29/7811* (2013.01); *H01L 29/861* (2013.01)

(58) Field of Classification Search
CPC .............. H01L 29/0619; H01L 29/402; H01L 29/7811
See application file for complete search history.

(56) References Cited

U.S. PATENT DOCUMENTS

| 5,691,553 A | 11/1997 | Mori et al. |
| 2008/0169526 A1 | 7/2008 | Wakimoto et al. |

(Continued)

FOREIGN PATENT DOCUMENTS

| JP | 8-88346 | 4/1996 |
| JP | 2001-44414 | 2/2001 |

(Continued)

OTHER PUBLICATIONS

International Search Report mailed on Feb. 25, 2014 in corresponding International Patent Application No. PCT/JP2013/081438.

*Primary Examiner* — Thanh V Pham

(57) ABSTRACT

In a semiconductor device, an edge termination region which surrounds an active region includes an electric field reduction mechanism including guard rings, first field plates which come into contact with the guard rings, and second field plates which are provided on the first field plates, with an interlayer insulating film interposed therebetween. The second field plate is thicker than the first field plate. A gap between the second field plates is greater than a gap between the first field plates. A barrier metal film is provided between the second field plate and the interlayer insulating film so as come into conductive contact with the second field plate. A gap between the barrier metal films is equal to the gap between the first field plates.

18 Claims, 6 Drawing Sheets

(51) Int. Cl.
*H01L 29/861* (2006.01)
*H01L 29/739* (2006.01)
*H01L 29/78* (2006.01)
*H01L 29/49* (2006.01)

(56) References Cited

U.S. PATENT DOCUMENTS

2010/0264507 A1 10/2010 Takahashi et al.
2011/0204469 A1 8/2011 Onishi
2012/0153349 A1 6/2012 Suzuki
2014/0077329 A1 3/2014 Abe

FOREIGN PATENT DOCUMENTS

| | | |
|---|---|---|
| JP | 2004-158844 | 6/2004 |
| JP | 2008-193043 | 8/2008 |
| JP | 2009-117715 | 5/2009 |
| JP | 2010-251553 | 11/2010 |
| JP | 2011-171552 | 9/2011 |
| JP | 2012-134198 | 7/2012 |
| WO | WO 2013/021727 A1 | 2/2013 |

SEMICONDUCTOR DEVICE WITH AN ELECTRIC FIELD REDUCTION MECHANISM IN AN EDGE TERMINATION REGION SURROUNDING THE ACTIVE REGION

CROSS-REFERENCE TO RELATED APPLICATIONS

This is a continuation application, filed under 35 U.S.C. §111(a), of International Patent Application No. PCT/JP2013/081438 filed on Nov. 21, 2013, which claims the foreign benefit of Japanese Patent Application No. 2012-261222, filed on Nov. 29, 2012, the disclosures of all of which are incorporated herein by reference.

BACKGROUND

1. Field

The present disclosure relates to a semiconductor device.

2. Description of Related Art

A technique has been developed which increases the breakdown voltage of a semiconductor module including a power semiconductor device, such as an insulated gate bipolar transistor (IGBT), a free wheeling diode (FWD), or an insulated gate field effect transistor (MOSFET). It is necessary to increase the breakdown voltage of each of the mounted devices in order to increase the breakdown voltage of the semiconductor module. In general, an active region, which is a semiconductor function region formed at the center of a semiconductor substrate, is provided in each semiconductor chip mounted in the power semiconductor device. A metal electrode is provided on the surface of the active region so as to come into contact with the active region. A main current flows in the active region when the semiconductor device is in an on state.

An edge termination region is provided around the semiconductor function region (active region) so as to surround the outside of the front surface side of the substrate at the circumferential end of the semiconductor function region. The edge termination region has an electric field reduction structure for preventing the generation of a region having an electric field higher than that at the center of the bottom of the semiconductor function region (the center of the rear surface of the substrate) when a reverse bias is applied to a main pn junction on the front surface side of the substrate (hereinafter, simply referred to as a main pn junction). The electric field reduction structure means a region which reduces the electric field on the front surface side of the substrate in a drift region to hold the breakdown voltage. For example, a guard ring or a field plate which covers the guard ring is provided as the electric field reduction structure.

The field plate has a function of reducing a high electric field which is likely to be generated in the edge termination region. Specifically, the field plate makes it easier for a depletion layer, which is mainly spread from the main pn junction to the drift layer with an increase in the reverse voltage when the reverse bias is applied to the main pn junction, to be spread in the edge termination region than at the center of the bottom of the semiconductor. Therefore, the gap between the equipotential lines increases and a high electric field generated in the edge termination region is reduced. In addition, the field plate has a function of shielding an external charge (for example, a free ion) which is generated in the vicinity of the front surface of the substrate in the edge termination region due to, for example, a molding resin to suppress a change in the electric field in the vicinity of the interface between the molding resin and the front surface of the semiconductor substrate. Since the change in the electric field is suppressed by the field plate, it is possible to hold the reliability of the breakdown voltage.

The field plate is, for example, a laminate of a plurality of metal films. In many cases, the field plate is formed at the same time as any one of a pad electrode metal film (for example, an aluminum (Al) alloy film (Al—Si (1.5%) alloy film) including 1.5% of silicon (Si)) for wire bonding, a polysilicon film for a gate electrode, and a barrier metal film for preventing diffusion, in order to simplify the process required to form the field plate. The pad electrode metal film, such as an aluminum alloy film, is preferably applied to the uppermost field plates which are easy to arrange with a large gap therebetween since it has a large thickness of 5 µm or more and requires wet etching with a large amount of side etching during a patterning process (patterning). Since the polysilicon film for a gate electrode or the barrier metal for preventing diffusion preferably has a small thickness of 1 µm or less and can be patterned by dry etching, it is particularly suitable to form the lower field plates with a narrow ring interval.

Next, the structure of an edge termination region of a semiconductor device according to the related art will be described. FIG. 2 is a cross-sectional view illustrating the structure of the edge termination region of the semiconductor device according to the related art. FIG. 2 part (a) is a cross-sectional view illustrating a main portion of an edge termination region 200 that surrounds the outer circumference of an active region 201 in which a main current flows. FIG. 2 part (b) is an enlarged cross-sectional view illustrating a dashed frame of FIG. 2 part (a). As illustrated in FIG. 2, the edge termination region 200 which surrounds the outer circumference of the active region 201 is provided in the outer circumference of the active region 201 of a semiconductor substrate 1. An electric field reduction structure including guard rings 2 and first and second field plates 4 and 7 is provided in the edge termination region 200.

Specifically, in the edge termination region 200, five guard rings 2 are provided in a substantially ring shape surrounding the active region 201 in a surface layer of the front surface of the semiconductor substrate 1. In addition, the second field plate 7 is provided on the guard ring 2, with a laminate of a field insulating film 3, the first field plate 4, and an interlayer insulating film 5 interposed therebetween, on the front surface of the semiconductor substrate 1. The first field plate 4 comes into contact with the guard ring 2 through a contact hole provided in the field insulating film 3. The second field plate 7 is made of an aluminum alloy (Al—Si alloy) and is formed at the same time as a main electrode which is formed on the front surface of the substrate in the active region 201.

The second field plates 7 do not need to be formed on all of the guard rings 2. That is, the second field plates 7 may be formed on some or at least one of a plurality of guard rings 2. For example, the second field plates 7 may be arranged on every other guard ring 2 among the plurality of guard rings 2. In this case, it is possible to increase the gap between the second field plates 7. Therefore, even when a thick aluminum alloy film is patterned by wet etching to form the second field plate 7, it is possible to pattern the aluminum alloy film in a short time without any problem, which is preferable.

Next, the structure of the field insulating film 3, the first field plate 4, and the interlayer insulating film 5 will be described in detail with reference to FIG. 2 part (b). The field insulating film 3 is formed on the front surface of the semiconductor substrate 1. A contact hole is provided in the field insulating film 3 at a position corresponding to the surface of each guard ring 2. The first field plate 4 is a polysilicon film which is formed on the field insulating film 3. The polysilicon film which is provided as the first field plate 4 comes into contact with the surface of the guard ring 2 in the contact hole of the field insulating film 3. The polysilicon film (first field plate 4) is formed at the same time as a gate electrode (not illustrated) in the active region 201.

The end of the first field plate 4 protrudes onto the field insulating film 3 which is formed on the surface of a region between the guard rings 2 such that the function of the first field plate 4 can be appropriately fulfilled. Since the polysilicon film (first field plate 4) is a thin film (1 μm), it can be finely patterned by dry etching. Therefore, the gap between the first field plates 4 can be less than the gap between the patterns of the aluminum alloy film which will be the second field plate 7. As a result, it is possible to reduce the influence of an external charge on the electric field in the vicinity of the front surface of the semiconductor substrate 1.

After the first field plate 4 is patterned, the interlayer insulating film 5 is formed on the first field plate 4 at the same time as an interlayer insulating film is formed in the active region 201. Then, the aluminum alloy film is formed as the second field plate 7 on the interlayer insulating film 5 at the same time as the electrode film is formed in the active region 201. A polyimide film 8 serving as a surface protective film which covers the entire front surface of the substrate is formed on the second field plate 7. Although not illustrated in FIG. 2, the first field plate 4 and the second field plate 7 are contacted with each other by a portion (not illustrated) (for example, a corner portion) of each guard ring 2. Therefore, the first and second field plates 4 and 7 each have the same potential as the surface of the guard ring 2.

The following known documents have been proposed for a semiconductor device including the field plate. A device has been proposed which includes a thin polysilicon film that is provided on a guard ring with a ring shape, with an insulating film interposed therebetween, and a two-layer field plate structure including a metal film that is formed on the polysilicon film, with an insulating film interposed therebetween, and is thicker than the polysilicon film (for example, see JP 2008-193043 A (FIG. 1 and abstract)). In addition, a device has been proposed which includes a field plate structure and inserts barrier metal between an aluminum electrode and a semiconductor substrate to connect them (for example, see JP 2009-117715 A (paragraph 0036)). Furthermore, a device has been proposed which has an electrode including a barrier metal layer that is provided on a semiconductor function region or a barrier metal layer and an aluminum layer that is formed on the barrier metal layer (for example, see JP 2001-44414 A (FIG. 1 and Abstract)).

SUMMARY

However, in the related art, since the thickness (for example, 1 μm or less) of the first field plate 4 is significantly less than the thickness (for example, 5 μm or more) of the second field plate 7, the effect of shielding the external charge is not sufficient. Therefore, there is a concern that a problem will occurs in the reliability of the breakdown voltage.

Embodiments of the invention solve the above-mentioned problems of the related art by providing a semiconductor device which can improve the effect of shielding an external charge even in a structure including a first field plate that is provided on the surface of a semiconductor substrate and a second field plate that is provided on the first field plate, with an insulating film interposed therebetween, and is thicker than the first field plate.

In order to solve the above-mentioned problems, a semiconductor device according to one aspect of the invention has the following characteristics. An active region is provided in one main surface of a semiconductor substrate. An edge termination region is provided so as to surround the active region. In the edge termination region, a plurality of guard rings are provided in a surface layer of the one main surface of the semiconductor substrate. Field plates which have the same potential as the guard rings are provided on the guard rings. An electric field reduction mechanism includes the guard rings and the field plates. The field plates include first and second field plates. The first field plate is provided on the surface of the guard ring. The second field plate is provided on the first field plate, with an interlayer insulating film interposed therebetween. A gap between the second field plates is greater than a gap between the first field plates. The second field plate is thicker than the first field plate. A barrier metal film is provided between the second field plate and the interlayer insulating film so as to come into conductive contact with the second field plate. A gap between the barrier metal films is substantially equal to the gap between the first field plates.

In the semiconductor device according to the above-mentioned aspect of the invention, the barrier metal film may have, as a main component, metal having a higher melting point than the second field plate.

In the semiconductor device according to the above-mentioned aspect of the invention, the barrier metal film may have, as the main component, any one of titanium, titanium nitride, tantalum, tantalum nitride, titanium tungsten, and molybdenum.

In the semiconductor device according to the above-mentioned aspect of the invention, the barrier metal film may have a thickness that is equal to or greater than 50 nm and equal to less than 300 nm.

In the semiconductor device according to the above-mentioned aspect of the invention, the interlayer insulating film may have a large thickness in an allowable range of a process.

In the semiconductor device according to the above-mentioned aspect of the invention, the first field plate may be a polysilicon film.

In the semiconductor device according to the above-mentioned aspect of the invention, the first field plate may have a thickness of 1 μm or less.

In the semiconductor device according to the above-mentioned aspect of the invention, the second field plate may have, as a main component, metal including aluminum and silicon.

In the semiconductor device according to the above-mentioned aspect of the invention, the second field plate may have a thickness of 5 μm or more.

According to the semiconductor device of embodiments of the invention, it is possible to provide a semiconductor device which can improve the effect of shielding an external charge even in a structure that includes field plates including first field plates which are lower thin films and second field plates which are upper films, are provided on the first field plates, with an insulating film interposed therebetween, are thicker than the first field plates, and are arranged at greater intervals than the first field plates.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1:
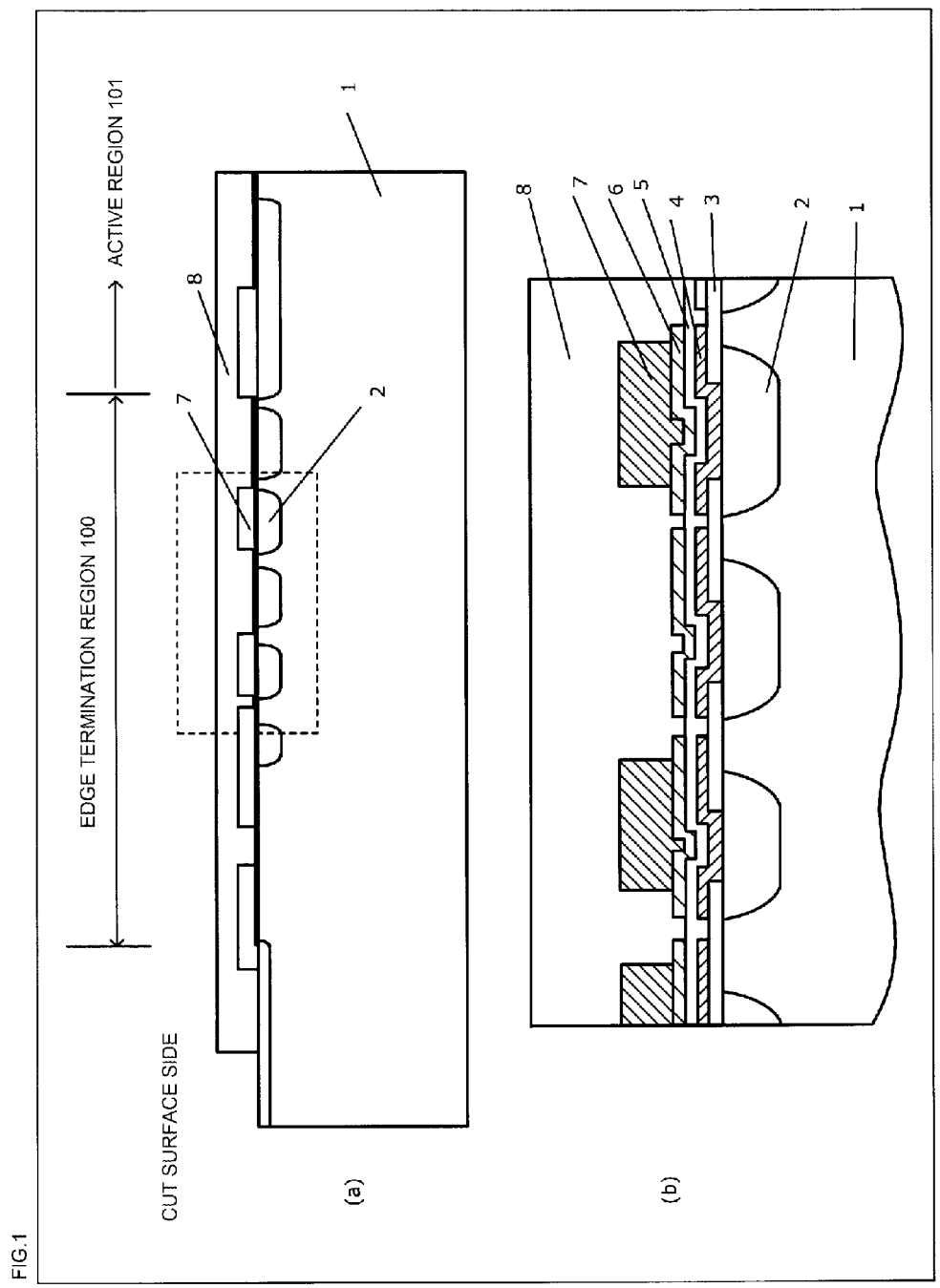
FIG. 1 is a cross-sectional view illustrating the structure of an edge termination region of a semiconductor device according to an embodiment of the invention.

Reference will now be made in detail to the embodiments, examples of which are illustrated in the accompanying drawings, wherein like reference numerals refer to the like elements throughout. The embodiments are described below to explain the present invention by referring to the figures.

Hereinafter, an embodiment of a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layers without the symbols. In the description of the following embodiment and the accompanying drawings, the same components are denoted by the same reference numerals and the description thereof will not be repeated. In addition, in the accompanying drawings described in the embodiment, for ease of viewing or understanding, a scale and a dimensional ratio are different from the actual scale and dimensional ratio. The invention is not limited to the following embodiment as long as it does not depart from the scope and spirit thereof.

The structure of a semiconductor device according to an embodiment of the invention will be described. FIG. 1 is a cross-sectional view illustrating the structure of an edge termination region of the semiconductor device according to the embodiment of the invention. FIG. 1 part (a) is a cross-sectional view illustrating a main portion of an edge termination region 100 that surrounds the outer circumference of an active region 101 in which a main current flows. FIG. 1 part (b) is an enlarged cross-sectional view illustrating a frame which is represented by a dashed line in FIG. 1 part (a). In FIG. 1 part (a), a cut surface means a chip cut surface which is exposed when a semiconductor wafer is diced (cut) into chips. As illustrated in FIG. 1, the semiconductor device according to the embodiment includes the active region 101 in which the main current flows and the edge termination region 100 that surrounds the outer circumference of the active region 101, similarly to the semiconductor device according to the related art. An electric field reduction structure including a guard ring 2 and first and second field plates 4 and 7 are provided in the edge termination region 100.

The structure of the edge termination region 100 will be described in detail. In the edge termination region 100, five guard rings 2 that surround the active region 101 are provided fivefold (substantially in a ring shape) at predetermined intervals in a surface layer of a front surface of a semiconductor substrate (semiconductor chip) 1. In addition, a laminate of a field insulating film 3, a first field plate 4, an interlayer insulating film 5, and a barrier metal film 6 is formed on each of the guard rings 2 on the front surface of the semiconductor substrate 1 and a second field plate 7 is provided on the laminate. Reference numeral 8 is a polyimide film. The first field plate 4 comes into contact with the guard ring 2 through a contact hole provided in the field insulating film 3. Since the field insulating film 3, the first field plate 4, the interlayer insulating film 5, and the barrier metal film 6 each have a small thickness, a laminate thereof is represented by a thick straight line in FIG. 1 part (a).

The second field plate 7 is a metal film made of an aluminum alloy which includes, for example, 1.5% of silicon (Si) (hereinafter, referred to as an Al—Si (1.5%) alloy) and is provided in a substantially ring shape surrounding the active region 101. For example, the second field plate 7 may be formed at the same time as a main electrode which is formed on the front surface of the semiconductor substrate 1 in the active region 101. In addition, the second field plate 7 does not need to be formed on all of the guard rings 2. That is, the second field plate 7 may be formed on some or at least one of the plurality of guard rings 2. For example, the second field plate 7 may be formed on every other guard ring 2 among the plurality of guard rings 2. In this case, it is possible to increase the gap between the second field plates 7. Therefore, even when a thick aluminum alloy film with a thickness of 5 μm or more is patterned by wet etching to form the second field plate 7, it is easy to pattern the aluminum alloy film and it is possible to perform processing in a short time, which is preferable.

Next, the structure of the field insulating film 3, the first field plate 4, the interlayer insulating film 5, and the barrier metal film 6 will be described in detail with reference to FIG. 1 part (b). The field insulating film 3 is formed on the front surface of the semiconductor substrate 1. In the field insulating film 3, a contact hole which has, for example, a substantially ring shape surrounding the active region 101 is provided at a position corresponding to a portion of the surface of each guard ring 2. The first field plate 4 which is, for example, a polysilicon film is provided on the field insulating film 3. The polysilicon film which is deposited (formed) as the first field plate 4 comes into contact with the surface of the guard ring 2 in the contact hole of the field insulating film 3. The polysilicon film (first field plate 4) may be formed at the same time as a gate electrode (not illustrated) in the active region 101.

The inner end (close to the center of the substrate) and outer end (close to the outer circumference of the substrate) of the first field plate 4 may protrude with a predetermined width (hereinafter, referred to as a protrusion width) onto the field insulating film 3 which is formed between the guard rings 2 such that the function of the first field plate 4 is appropriately fulfilled. In addition, the first field plate 4 may be formed in a substantially ring shape surrounding the active region 101. Since the polysilicon film (first field plate 4) is a thin film (for example, with a thickness of about 1 μm or less), it can be finely patterned by dry etching and it is possible to control the protrusion with to a predetermined small width. In addition, since the polysilicon film can be finely patterned by dry etching, the gap between the plurality of first field plates 4 in the planar direction (a direction parallel to the front surface of the substrate) can be controlled to be smaller than the gap between the patterns of an aluminum alloy film which will be described the second field plate 7. Therefore, it is possible to reduce the adverse effect of an external charge on the electric field in the vicinity of the front surface of the semiconductor substrate 1. An example of the external charge is a free ion which is generated in the vicinity of the front surface of the substrate in the edge termination region 100 due to, for example, a molding resin (not illustrated).

Figure 6:
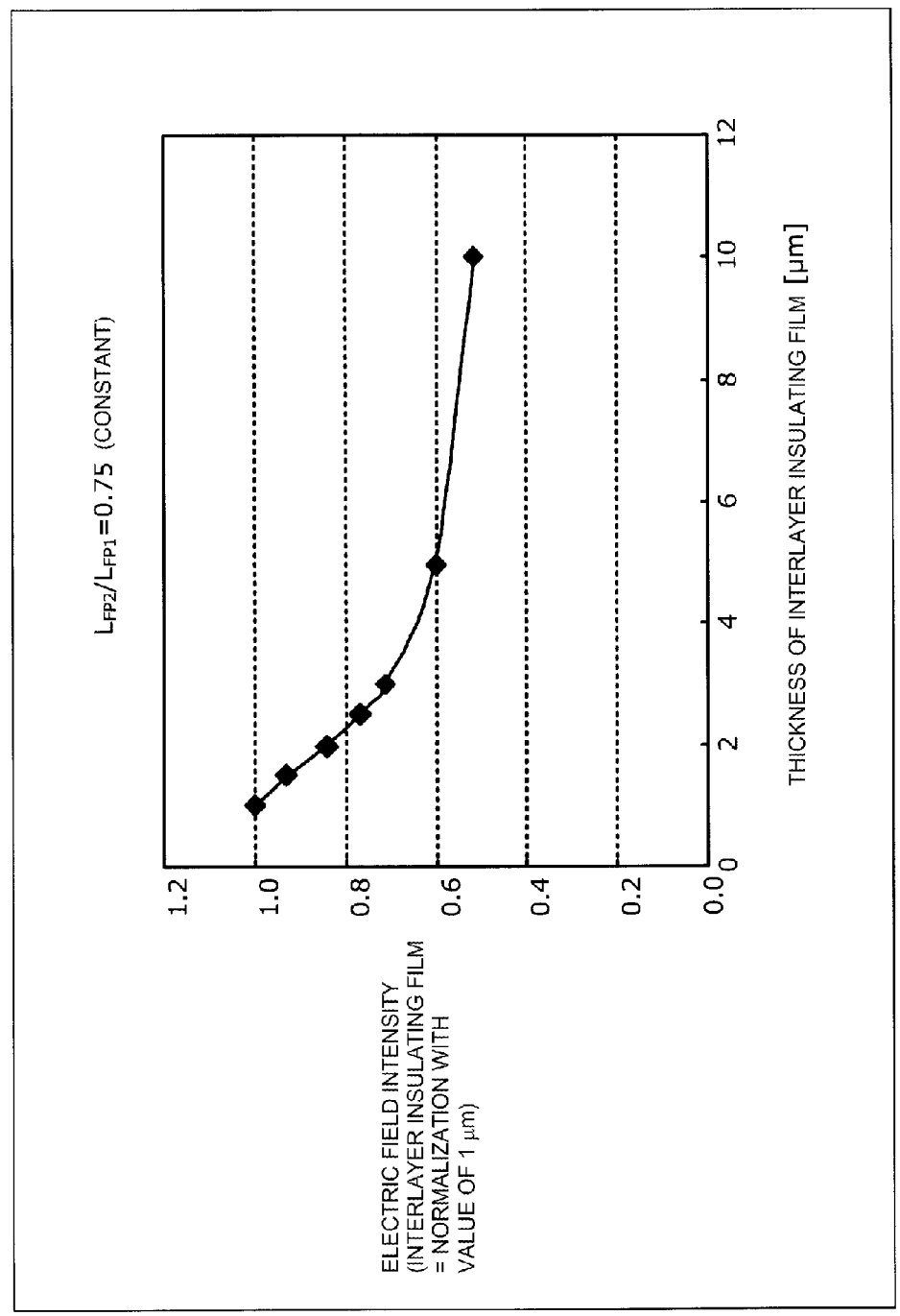
FIG. 6 is a characteristic diagram illustrating the relationship between the thickness of an interlayer insulating film provided between a second field plate and the first field plate and the electric field intensity between the first field plates.

The interlayer insulating film 5 is formed with a thickness that is, for example, equal to or greater than 1 µm and equal to or less than 10 µm on the first field plate 4 by a chemical vapor deposition (CVD) method. The interlayer insulating film 5 may be formed at the same time as an interlayer insulating film in the active region 101. The thickness of the interlayer insulating film 5 may be as large as possible in the allowable range of the process. This is because the thickness of the interlayer insulating film 5 between the second field plate 7 and the first field plate 4 increases to reduce the electric field intensity between the first field plates 4. For the thickness of the interlayer insulating film 5, FIG. 6 illustrates the relationship between the thickness of the interlayer insulating film 5 between the second field plate 7 and the first field plate 4 and the electric field intensity between the first field plates 4. FIG. 6 is a characteristic diagram illustrating the relationship between the thickness of the interlayer insulating film between the second field plate and the first field plate and the electric field intensity between the first field plates.

In FIG. 6, the horizontal axis indicates the thickness of the interlayer insulating film 5 between the second field plate and the first field plate 4. In FIG. 6, the vertical axis indicates the ratio of the electric field intensity between the first field plates 4 corresponding to the thickness of the interlayer insulating film 5 with respect to the electric field intensity (=1.0 times) between the first field plates 4 when the thickness of the interlayer insulating film 5 is 1 µm. The ratio of the ring width $L_{FP2}$ of the second field plate 7 to the width $L_{FP1}$ (a width in a direction from the center to the outer circumference of the substrate; hereinafter, referred to as a ring width) of the first field plate 4 (hereinafter, referred to as the ratio of $L_{FP2}/L_{FP1}$) was 0.75 ($L_{FP2}/L_{FP1}$=0.75). The result illustrated in FIG. 6 proved that, when the thickness of the interlayer insulating film 5 increased, the electric field intensity between the first field plates 4 was reduced. For example, when the interlayer insulating film 5 has a large thickness of 5 µm and 10 µm, the electric field intensity between the first field plates 4 is 0.6 times and 0.5 times the electric field intensity when the interlayer insulating film 5 has a thickness of 1 µm.

Figure 2:
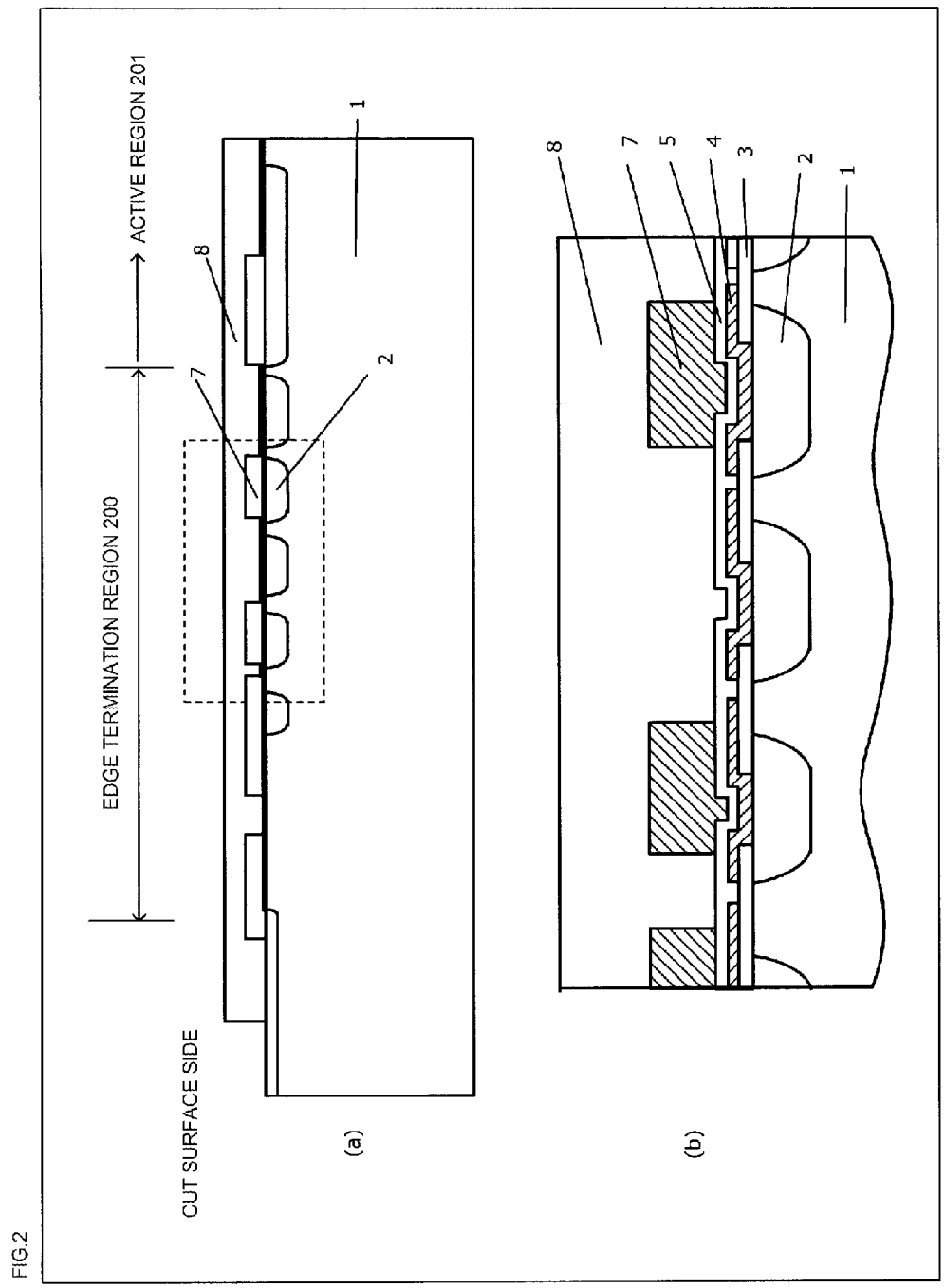
FIG. 2 is a cross-sectional view illustrating the structure of an edge termination region of a semiconductor device according to the related art.

The barrier metal film 6 is formed on the interlayer insulating film 5 at a position where it substantially overlaps the first field plate 4, which is provided below the barrier metal film 6, in the depth direction. The structure according to the invention differs, in one respect, from the structure (FIG. 2) according to the related art in that the barrier metal film 6 is provided between the interlayer insulating film 5 and the second field plate 7. The barrier metal film 6 is provided in, for example, a substantially ring shape surrounding the active region 101. The ring width $L_{FP3}$ of the barrier metal film 6 is substantially equal to the ring width $L_{FP1}$ of the first field plate 4. For example, the barrier metal film 6 may be formed as follows. First, the barrier metal film 6 which has, for example, titanium nitride (TiN) as a main component is formed with a thickness of 100 nm on the interlayer insulating film 5 by sputtering. Then, the barrier metal film 6 is patterned by a photolithography process and dry etching in a ring pattern shape which has substantially the same ring width $L_{FP3}$ as the ring width $L_{FP1}$ of the polysilicon film which is the first field plate 4 and overlaps the first field plate 4 at the same position. In this way, the barrier metal film 6 with a predetermined ring width $L_{FP3}$ is formed above the first field plate 4 at a predetermined position.

The barrier metal is a general term for a metal film which is provided between the metal film and a contact film that comes into contact with the metal film in order to prevent the diffusion of the metal film to the contact film or the mutual reaction therebetween. In many cases, a material with low reactivity with other materials, such as a material which has high adhesion with the mutual bases (the metal film and the contact film) and a high melting point, is used as the barrier metal. For example, titanium (Ti), titanium nitride (TiN), tantalum (Ta), tantalum nitride (TaN), titanium tungsten (TiW), and molybdenum (Mo) have been known as barrier metals. However, titanium nitride (TiN) is most preferable as the barrier metal of aluminum (Al). That the ring width $L_{FP3}$ of the barrier metal film 6 is substantially equal to the ring width $L_{FP1}$ of the first field plate 4 (polysilicon film) means that the gap between the first field plates 4 is substantially equal to the gap between the barrier metal films 6. It is preferable that the thickness of the barrier metal film 6 be in the range of about 50 nm to 300 nm. The reason is that it is difficult to finely pattern the barrier metal film 6 using etching when the thickness of the barrier metal film 6 is too large and the formation of a film is affected by a manufacturing variation when the thickness of the barrier metal film 6 is too small.

An aluminum alloy film which is made of, for example, an Al—Si (1.5%) alloy is formed as the second field plate 7 on the barrier metal film 6. The second field plate 7 may be formed at the same time as the electrode film (for example, the main electrode: not illustrated) in the active region 101. The aluminum alloy film which is the second field plate 7 comes into conductive contact with the barrier metal film 6. It is preferable that the second field plate 7 have a large thickness of, for example, 5 µm or more. The reason is as follows. When the main electrode in the active region 101 is formed at the same time as the second field plate 7, an aluminum alloy film (main electrode) made of an Al—Si (1.5%) alloy which is formed in the active region 101 is bonded by an aluminum wire in order to be connected to, for example, an external connection terminal. The main electrode to which the aluminum wire is bonded needs to have a large thickness of 5 µm or more in order to absorb collision during ultrasonic bonding due to the wire bonding. In addition, the ring width $L_{FP2}$ of the second field plate 7 is less than the ring width $L_{FP1}$ of the first field plate 4. The reason is as follows. Since the second field plate 7 has a large thickness of 5 µm or more, it needs to be subjected to wet etching which has a large amount of side etching during patterning. Therefore, the ring width $L_{FP2}$ of the second field plate 7 is less than the ring width $L_{FP1}$ of the first field plate 4 which is patterned by dry etching.

Figure 5:
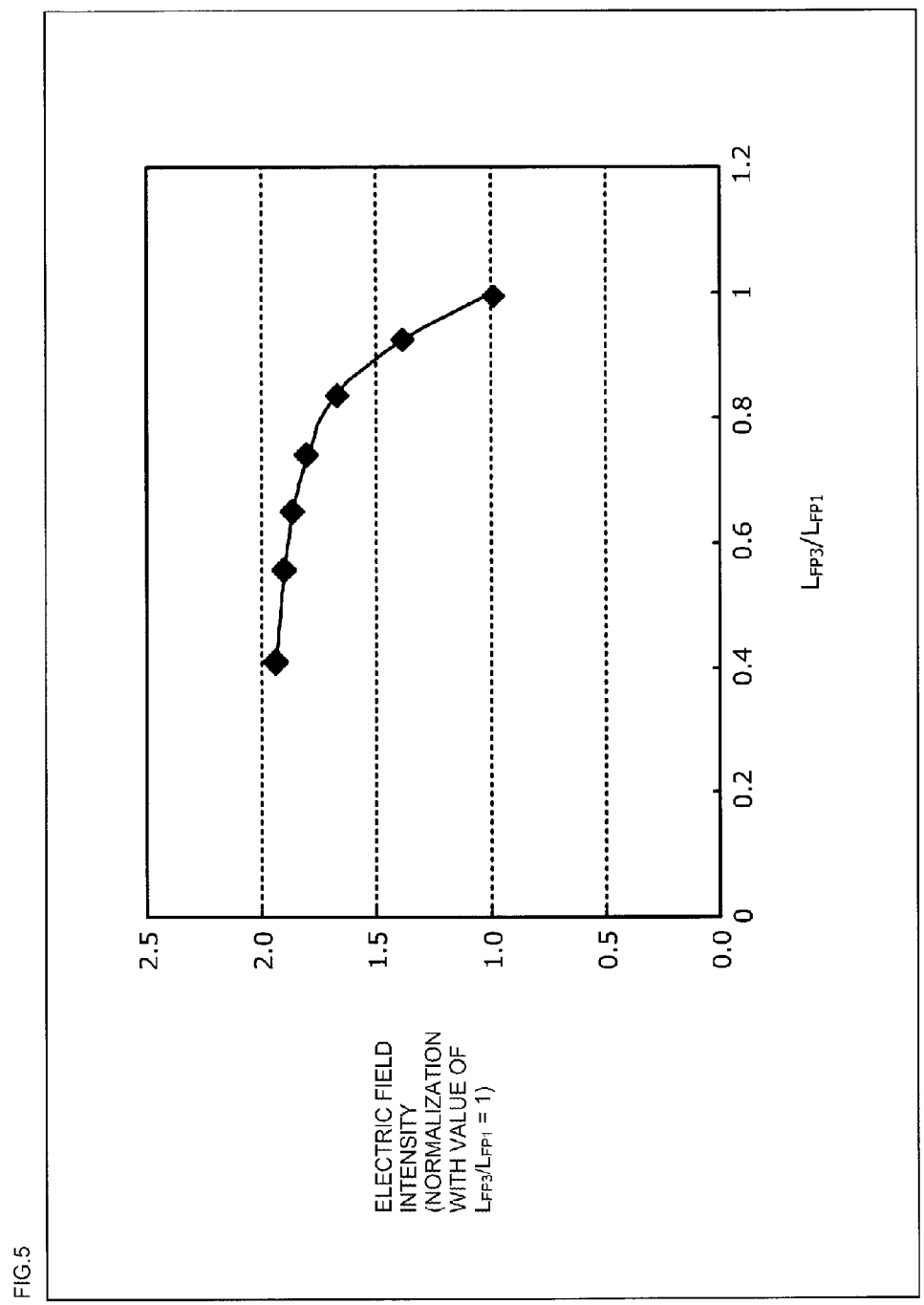
FIG. 5 is a characteristic diagram illustrating the relationship between the ratio of the ring width $L_{FP3}$ of a barrier metal film to the ring width $L_{FP1}$ of a first field plate and electric field intensity in the vicinity of a space between the first field plates.

Next, the structure in which the ring width $L_{FP3}$ of the barrier metal film 6 is substantially equal to the ring width $L_{FP1}$ of the first field plate 4 will be described. FIG. 5 is a characteristic diagram illustrating the relationship between the ratio of the ring width $L_{FP3}$ of the barrier metal film 6 to the ring width $L_{FP1}$ of the first field plate (hereinafter, referred to as the ratio of $L_{FP3}/L_{FP1}$) and the electric field intensity in the vicinity of a space between the first field plates 4. In FIG. 5, the horizontal axis indicates the ratio of $L_{FP3}/L_{FP1}$. In FIG. 5, the vertical axis indicates the ratio of the electric field intensity between the first field plates 4 corresponding to the ratio of $L_{FP3}/L_{FP1}$ with respect to the electric field intensity (=1.0 times) between the first field plates 4 when the ratio of $L_{FP3}/L_{FP1}$ is 1 (That is, $L_{FP3}=L_{FP1}$). As can be seen from the result illustrated in FIG. 5, as the ring width $L_{FP3}$ of the barrier metal film 6 becomes less than the ring width $L_{FP1}$ of the first field plate 4, the electric field intensity increases (for example, when the ratio of $L_{FP3}/L_{FP1}=0.4$, the electric field intensity between the first field plates 4 is about 1.9 times more than that when the ratio is 1).

Figure 3:
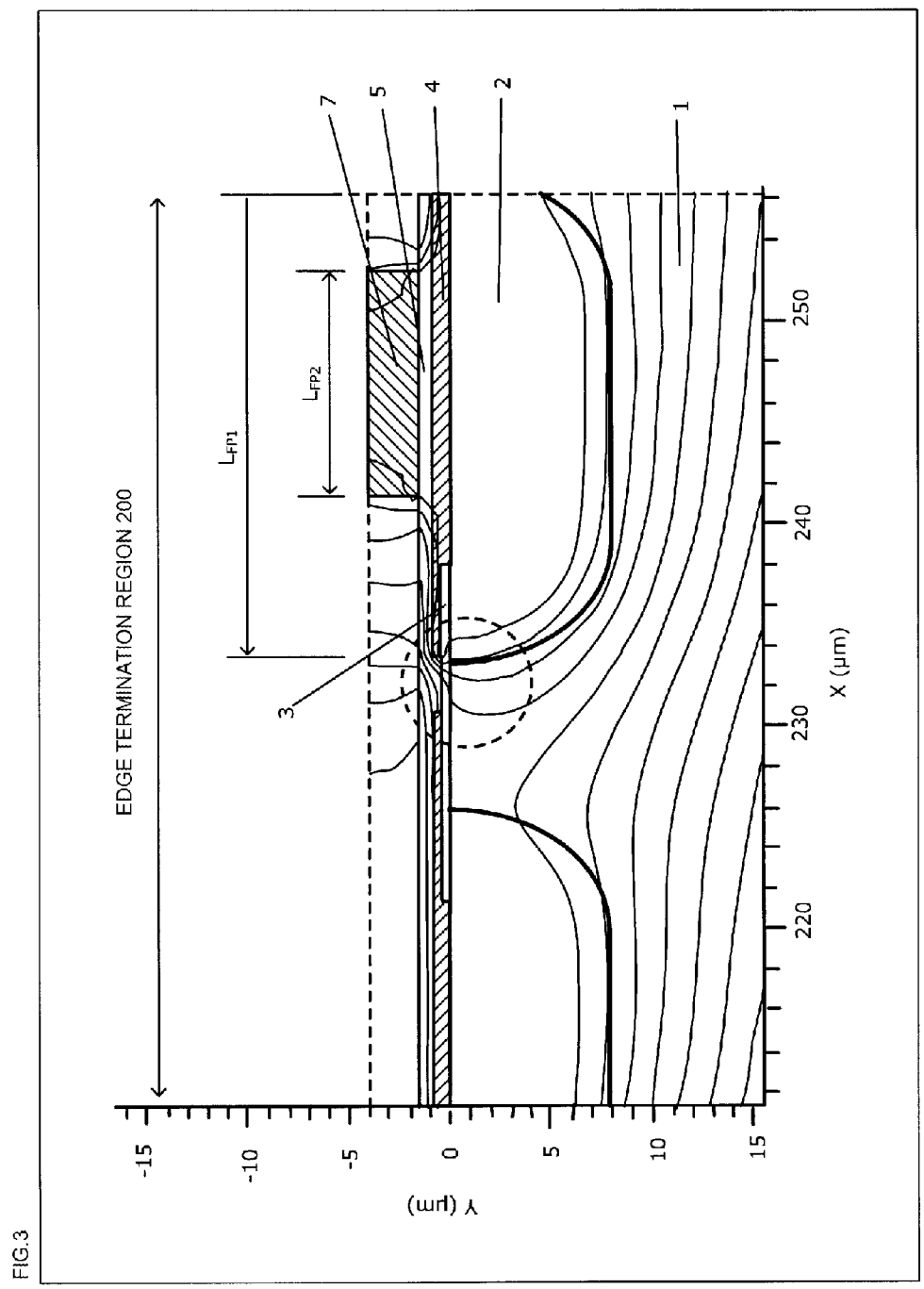
FIG. 3 is a cross-sectional view illustrating an equipotential line distribution of an electric field in the edge termination region when a reverse bias is applied to a main pn junction of the semiconductor device according to the related art.
Figure 4:
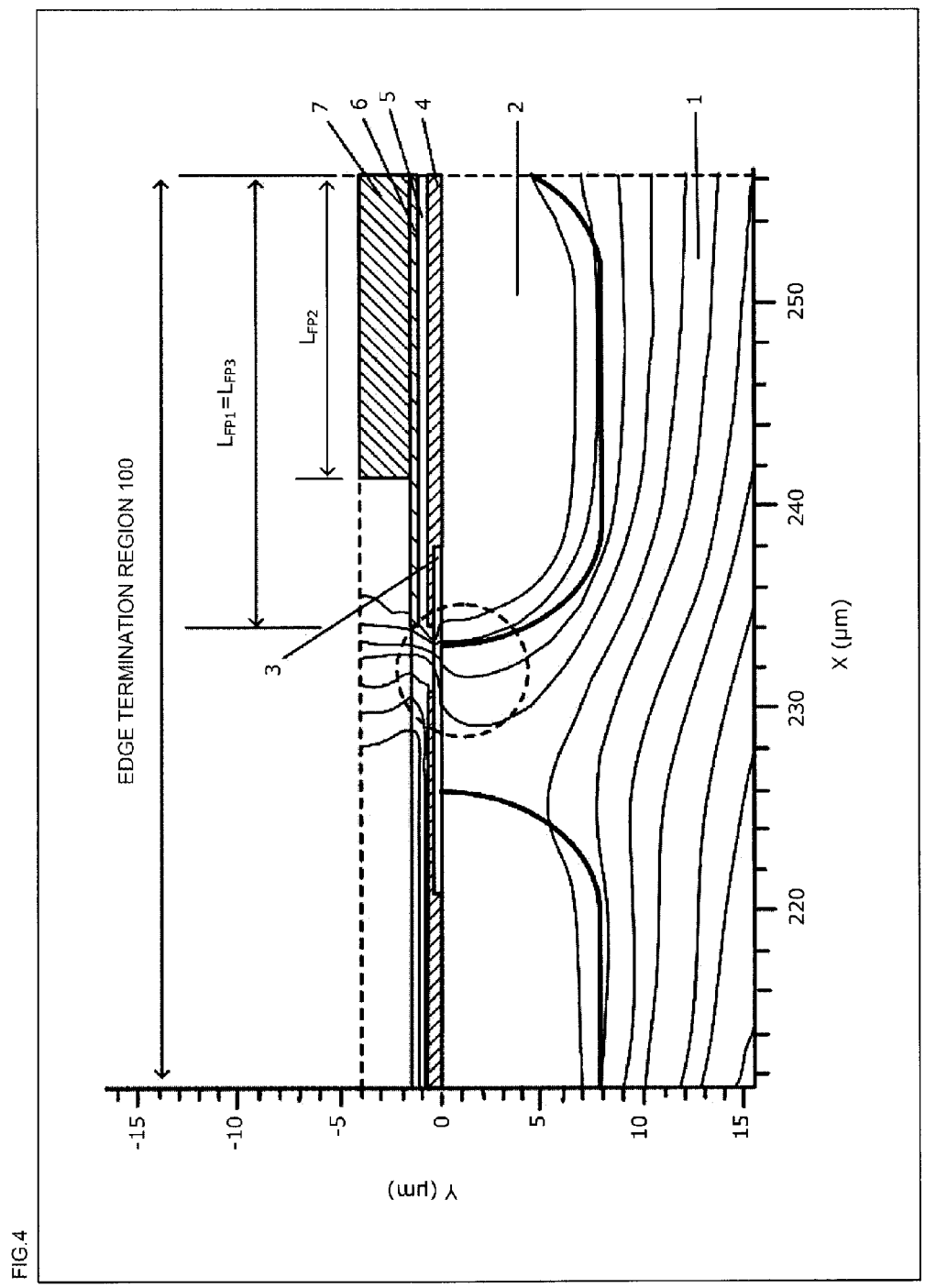
FIG. 4 is a cross-sectional view illustrating an equipotential line distribution of an electric field in the edge termination region when a reverse bias is applied to a main pn junction of the semiconductor device according to the invention.

FIG. 4 illustrates an equipotential line distribution of the electric field applied between the first field plates 4 when a reverse bias is applied to a main pn junction (hereinafter, simply referred to as a main pn junction) on the front surface side of the substrate in the active region in the semiconductor device according to the embodiment of the invention. As a comparative example, FIG. 3 illustrates an equipotential line distribution of the electric field between the first field plates 4 when a reverse bias is applied to a main pn junction in an active region 201 in the semiconductor device (that is, the structure without the barrier metal film 6, see FIG. 2) according to the related art. FIG. 3 is a cross-sectional view illustrating the equipotential line distribution of the electric field in an edge termination region when the reverse bias is applied to the main pn junction of the semiconductor device according to the related art. FIG. 4 is a cross-sectional view illustrating the equipotential line distribution of the electric field in the edge termination region when the reverse bias is applied to the main pn junction of the semiconductor device according to embodiments of the invention.

As can be seen from the comparison between the equipotential line distributions illustrated in FIGS. 3 and 4, the gap between the equipotential lines in a circular region represented by a dashed line in the semiconductor device according to the embodiment illustrated in FIG. 4 is greater than the gap between the equipotential lines in a circular region represented by a dashed line in the semiconductor device according to the related art illustrated in FIG. 3. That is, in the semiconductor device according to the embodiment illustrated in FIG. 4, the concentration of the electric field intensity between the first field plates 4 is reduced.

Although not illustrated in FIG. 1, the first field plate 4 and the second field plate 7 are conductively contacted with each other by a portion (not illustrated) of each guard ring 2 (for example, a corner portion of the guard ring 2 which has a substantially ring shape in a plan view). Therefore, the first and second field plates 4 and 7 each have the same potential as the surface of the guard ring 2.

According to the above-described embodiment, in the edge termination region, the barrier metal film which has the same ring width as the first field plate is provided on the first field plate, with the interlayer insulating film interposed therebetween, and the second field plate is provided on the barrier metal film so as to come into conductive contact with the barrier metal film. Therefore, even when the thickness of the second field plate is greater than the thickness of the first field plate and the gap between the second field plates is greater than the gap between the first field plates, it is possible to reduce the electric field intensity of the first field plate, as compared to the related art. Thus, it is possible to improve the effect of shielding an external charge. As a result, it is possible to provide a semiconductor device having an edge termination structure with high reliability.

The invention is not limited to the above-described embodiment, but various modifications and changes in the invention can be made without departing from the scope and spirit of the invention. For example, the element structure in the active region can vary depending on the design conditions and the invention can also be applied to, for example, IGBTs, FWDs, and MOSFETs. In addition, in each embodiment, the conductivity types (an n type or a p type) of the semiconductor substrate and the semiconductor region are not described. The conductivity types of the semiconductor substrate and the semiconductor region can vary depending on the element structure in the active region.

As described above, the semiconductor device according to embodiments of the invention is useful for power semiconductor devices with an edge termination structure which is provided so as to surround an active region, reduces the electric field on the front surface side of a substrate, and holds a breakdown voltage.

Reference signs and numerals are listed below:
1 SEMICONDUCTOR SUBSTRATE
2 GUARD RING
3 FIELD INSULATING FILM
4 FIRST FIELD PLATE
5 INTERLAYER INSULATING FILM
6 BARRIER METAL FILM
7 SECOND FIELD PLATE
8 POLYIMIDE FILM
100 EDGE DETERMINATION REGION
101 ACTIVE REGION
$L_{FP1}$ RING WIDTH OF FIRST FIELD PLATE
$L_{FP2}$ RING WIDTH OF SECOND FIELD PLATE
$L_{FP3}$ RING WIDTH OF BARRIER METAL FILM Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
an active region provided in one main surface of a semiconductor substrate;
an edge termination region surrounding the active region;
an electric field reduction mechanism provided in the edge termination region, the electric field reduction mechanism including a plurality of guard rings provided in a surface layer of the one main surface of the semiconductor substrate and field plates provided on the guard rings, the field plates having the same potential as the guard rings and including
first field plates provided on surfaces of the guard rings, and
second field plates provided on the first field plates and having a thickness greater than that of the first field plates, wherein a gap between the second field plates is greater than a gap between the first field plates;
an interlayer insulating film interposed between the first field plates and the second field plates; and
barrier metal films provided between the second field plate and the interlayer insulating film so as to be in conductive contact with the second field plates, wherein a gap between the barrier metal films is substantially equal to the gap between the first field plates.

2. The semiconductor device according to claim 1, wherein the barrier metal film has, as a main component, metal having a higher melting point than the second field plate.

3. The semiconductor device according to claim 2, wherein the barrier metal film has, as a main component, any one of titanium, titanium nitride, tantalum, tantalum nitride, titanium tungsten, and molybdenum.

4. The semiconductor device according to claim 1, wherein the barrier metal film has a thickness that is equal to or greater than 50 nm and equal to less than 300 nm.

5. The semiconductor device according to claim 1,
wherein the interlayer insulating film has a large thickness in an allowable range of a process.

6. The semiconductor device according to claim 1,
wherein the first field plate is a polysilicon film.

7. The semiconductor device according to claim 6,
wherein the first field plate has a thickness of 1 µm or less.

8. The semiconductor device according to claim 1,
wherein the second field plate has, as a main component, a metal including aluminum and silicon.

9. The semiconductor device according to claim 1,
wherein the second field plate has a thickness of 5 µm or more.

10. The semiconductor device according to claim 2,
wherein the second field plate has a thickness of 5 µm or more.

11. The semiconductor device according to claim 3,
wherein the second field plate has a thickness of 5 µm or more.

12. The semiconductor device according to claim 4,
wherein the second field plate has a thickness of 5 µm or more.

13. The semiconductor device according to claim 5,
wherein the second field plate has a thickness of 5 µm or more.

14. The semiconductor device according to claim 6,
wherein the second field plate has a thickness of 5 µm or more.

15. The semiconductor device according to claim 7,
wherein the second field plate has a thickness of 5 µm or more.

16. The semiconductor device according to claim 8,
wherein the second field plate has a thickness of 5 µm or more.

17. A semiconductor device comprising:
a guard ring provided in a main surface of a semiconductor substrate, the guard ring being in an edge termination region surrounding an active region of the semiconductor device;
a first field plate provided on a surface of the guard ring;
a second field plate provided on the first field plate and having a ring width smaller than that of the first field plate;
an interlayer insulating film interposed between the first field plate and the second field plate; and
a barrier metal film provided between the second field plate and the interlayer insulating film, the barrier metal film being in conductive contact with the second field plate and having a ring width greater than that of the second field plate.

18. The semiconductor device of claim 17, wherein the second field plate has a thickness at least five times that of a thickness of the first field plate.

* * * * *